United States Patent [19]

Carter et al.

[11] Patent Number: 5,298,194
[45] Date of Patent: Mar. 29, 1994

[54] ELECTRICALLY CONDUCTIVE POLYMER COMPOSITION

[75] Inventors: Richard Carter; Derrick Collett, both of Swindon, England

[73] Assignee: Raychem Limited, Swindon, England

[21] Appl. No.: 852,141

[22] PCT Filed: Nov. 1, 1990

[86] PCT No.: PCT/GB90/01677

§ 371 Date: Apr. 28, 1992

§ 102(e) Date: Apr. 28, 1992

[87] PCT Pub. No.: WO91/06961

PCT Pub. Date: May 16, 1991

[30] Foreign Application Priority Data

Nov. 1, 1989 [GB] United Kingdom ............ 8924616
Jul. 17, 1990 [GB] United Kingdom ............ 9015709

[51] Int. Cl.$^5$ .................. H01B 1/00; H01B 1/20; H01B 1/22
[52] U.S. Cl. ................... 252/512; 252/514; 252/518; 106/1.18; 106/1.19; 156/DIG. 101
[58] Field of Search ............ 252/512, 514, 518; 156/DIG. 101; 106/1.18, 1.19

[56] References Cited

U.S. PATENT DOCUMENTS

| | | | |
|---|---|---|---|
| 4,181,775 | 1/1980 | Corke | 428/348 |
| 4,467,002 | 8/1984 | Crofts | 428/36 |
| 4,569,786 | 2/1986 | Deguchi | 252/503 |
| 4,581,158 | 4/1986 | Lin | 252/514 |
| 4,596,670 | 6/1986 | Liu | 252/511 |
| 4,603,165 | 7/1986 | McDonald et al. | 524/440 |
| 4,707,388 | 11/1987 | Park et al. | 428/36 |
| 4,937,015 | 6/1990 | Krieg et al. | 252/511 |

FOREIGN PATENT DOCUMENTS

| | | |
|---|---|---|
| 59456 | 9/1982 | European Pat. Off. |
| 279979 | 8/1988 | European Pat. Off. |
| 351047 | 1/1990 | European Pat. Off. |
| 2050220 | 4/1971 | France |
| 363432 | 12/1931 | United Kingdom |
| 581184 | 10/1946 | United Kingdom |
| 1073567 | 6/1967 | United Kingdom |
| 1168701 | 10/1969 | United Kingdom |
| 1172629 | 12/1969 | United Kingdom |
| 1270611 | 4/1972 | United Kingdom |
| 1449539 | 9/1976 | United Kingdom |

OTHER PUBLICATIONS

International Search Report, International Application No. PCT/GB90/01677, filed Nov. 1, 1990.
British Patent Office Search Report, British Patent Application No. 8924616.9 filed Nov. 1, 1989.

*Primary Examiner*—Paul Lieberman
*Assistant Examiner*—M. Kopec
*Attorney, Agent, or Firm*—Marguerite E. Gerstner; Herbert G. Burkard

[57] ABSTRACT

A polymer composition comprises a solid fusible particulate polymer material and a quantity of metal particles that have been blended with the particles of polymer material to render the composition electrically conductive. The composition may be consolidated by subjecting the particulate blend to heat and/or pressure. The electrically conductive polymer composition may be used to connect the electrically conductive screen (7) of a dimensionally recoverable article (6) to the electrically conductive shield (4) of a cable (1).

19 Claims, 6 Drawing Sheets

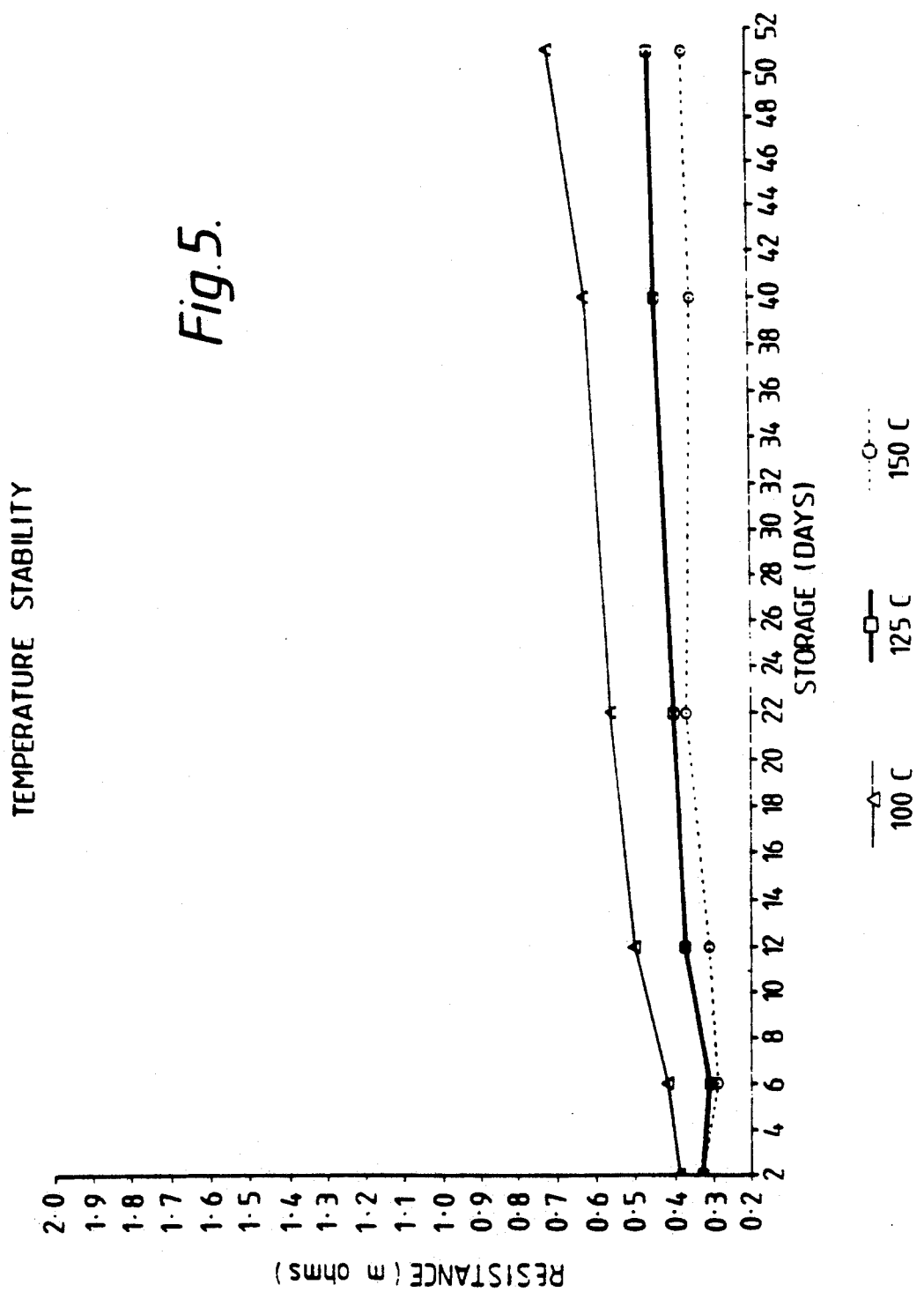

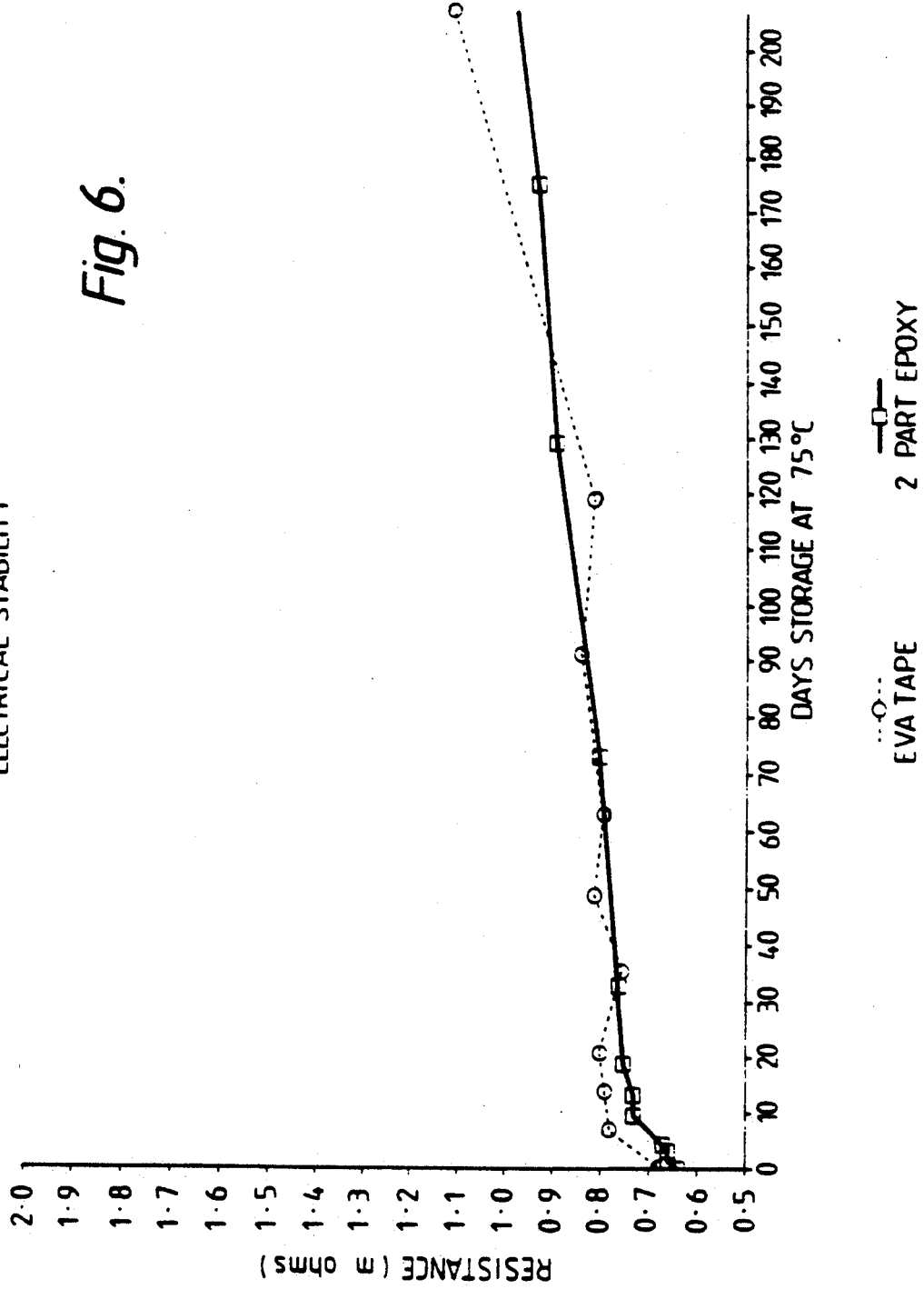

ELECTRICALLY CONDUCTIVE POLYMER COMPOSITION

BACKGROUND OF THE INVENTION

1. Field of the Invention

This invention relates to polymer compositions and especially to electrically conductive compositions.

2. Introduction to the Invention

Electrically conductive adhesives are employed in a number of fields where good electrical continuity is required. For example, when a shielded electrical cable is terminated with an electrical connector, a screened enclosure, e.g.: in the form of a dimensionally recoverable article, may be located over the connector and cable to provide a continuous screening between the connector and the cable shield. Such articles are described in U.S. Pat. No. 4,467,002, the disclosure of which is incorporated herein by reference. It is important to maintain a good electrical connection between the screen and the enclosure and both the connector and the cable shield, and electrically conductive adhesives have been employed for this purpose.

Electrically conductive adhesives can be formed by blending a quantity of electrically conductive material, e.g. a metal, into a solutions of the adhesive in a suitable solvent and evaporating the solvent. Normally silver flake is employed for this purpose in view of the relatively low bulk resistivities that can be achieved. The bulk resistivity of the adhesive will fall sharply with the increase in volume loading of metal until a so-called "percolation threshold" is reached after which the resistivity is low and relatively constant with respect to the metal loading. The silver loading employed will depend on the type of adhesive, but loadings in the region of 12-15% by volume may be used, may be used.

SUMMARY OF THE INVENTION

According to the present invention, there is provided an adhesive composition which comprises a solid fusible particulate polymer material and a quantity of metal particles that have been blended with the particles of polymer material to render the composition electrically conductive.

Preferably the metal particles have an aspect ratio (i.e. the ratio of their largest to smallest dimension) of at least 5 and especially at least 10, the particles preferably being in the form of flake.

We have observed that the metal flakes adhere to the surface of the polymer particles, which is at least partly due to tackiness of the polymer particles, so that when the adhesive is fused the metal flakes form a relatively nonuniform dispersion on a microscopic scale, in contrast with previously used adhesives in which a very uniform dispersion is obtained. On fusion of the adhesive particles, the metal flakes tend to remain in the same regions as before fusion, thereby forming a large number of metal-flake-rich conductive paths throughout the fused or resolidified composition. It has been found that the quantity of metal flake required in the composition to reach the percolation threshold can, at least in some cases, be significantly reduced. In addition it is possible to use the composition to form adhesive bonds whose electrical conductivity remains relatively constant over long periods of time at elevated temperatures.

BRIEF DESCRIPTION OF THE DRAWING

The invention is illustrated by the drawing in which,

FIG. 5 is a graph of the resistance of an adhesive composition of the invention as a function of storage time at different temperature; and FIG. 6 is a graph of the resistance of an adhesive composition of the invention as a function of storage at elevated temperature.

Figure 1:
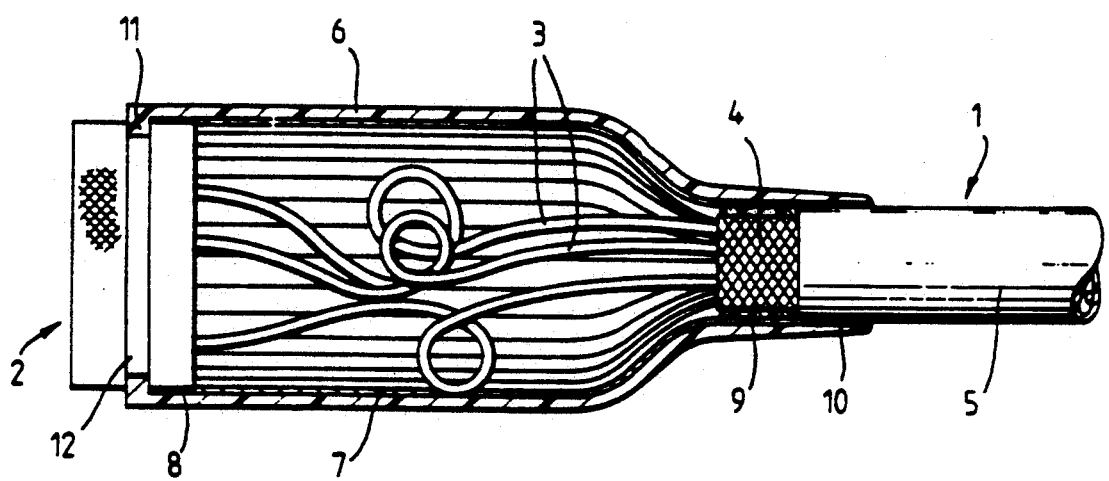
FIG. 1 is a section through an electrical cable of the invention.

The composition according to the present invention may be employed for a variety of purposes. For example, it may be employed as an adhesive where an electrically conductive adhesive joint is required. In such a case the polymer composition may for example be a hot-melt adhesive or a curable adhesive. In other cases the composition may be employed as a void filler or mastic.

Preferably, the adhesive composition includes not more than 12% by volume of the metal particles based on the total volume of the composition.

As hot-melt adhesives those based on olefin homo- or copolymers may be used e.g., low, medium or high density polyethylene, polypropylene, ethylene/vinyl acetate or ethylene/methyl acrylate copolymers may be employed. Alternatively the adhesive may be formed from a polyester, preferably one based on a polyalkylene diol having at least 3 carbon atoms or a cycloaliphatic diol, and an aromatic dicarboxylic acid, or a polyamide e.g., as described in in U.S. Pat. No. 4,181,775. In the case of hot-melt adhesives the adhesive preferably includes not more than 11%, more preferably not more than 10%, and especially not more than 9% by volume of metal particles based on the total volume of the conductive adhesive. Indeed, it is possible to form satisfactory adhesives with 5% or less by volume of metal particles or even 4% or less.

Normally the electrical resistance of the adhesive increases sharply as the loading of the metal particles is reduced below the percolation threshold. Thus, the loading of the metal particles should be above this and will normally be at least 1.5% by volume.

The invention has the further advantage that it enables the manufacture of electrically conductive hot-melt adhesives based on polymers such as ethylene/vinyl acetate polymers which are not soluble in common solvents and so cannot be blended with the metal particles in solution.

Where ethylene copolymers are employed acidic copolymers are preferred. Polymers which have an acid number (expressed in mgKOH/g) of at least 5, but preferably less than 200 and especially less than 100 (such as acidic ethylene vinyl acetate polymers and ethylene isobutyl acrylate, methacrylate acid terpolymers) may exhibit favorable electrical stability.

As curable or thermosetting adhesives, those described in U.S. Pat. No. 4,707,388 to Park et al may be used, the disclosure of which is incorporated herein by reference. These adhesives will cure by reaction of a plurality of mutually reactive components which exist separately from one another in the form of particles, and which will cure once the adhesive has been heated to fuse the particles. The adhesive is preferably based on an epoxy and a curing agent, for example a polyamide, carboxylic anhydride, phenolic resin or blocked isocyanate curing agent.

The composition may include one or more other components such as fillers, pigments, antioxidants and the like or agents for subsequent cross linking. Preferably it includes a binder, preferred binders including water-soluble polymers e.g. polyalkylene oxide, and latices. The binder is preferably present in the range of up to 20% by weight and especially from 1 to 10% by weight, based on the weight of the adhesive composition.

Where a curable adhesive is used it preferably includes not more than 15%, more preferably not more than 13%, and especially from 5 to 12% by volume of metal particles, based on the total volume of the conductive adhesive composition.

Preferably substantially all the particles have a size in the range of from 10 to 1000 micrometers. The preferred particle size will depend on the type of adhesive, at least to some extent. Preferably the particle size is at least 100 micrometers and especially at least 180 micrometers.

Preferably it is not more than 600 micrometers and especially not more than 300 micrometers. The metal particles should be sufficiently smaller than the polymer particles to enable them to coat the surface of the polymer particles. Preferably the ratio of the weight average size of the adhesive particles to that of the metal particles is in the range of from 10:1 to 200:1 and especially from 20:1 to 100:1.

Preferably the polymer material has a melt index of less than 100.

This invention also provides a dimensionally recoverable article which is coated on at least part of its internal surface with such an adhesive composition. The article may contain an electrically conductive screen, for example to provide e.m.i. shielding to a cable connection, in which case the conductive composition is preferably located in contact with part of the screen for forming an electrical connection between the screen and a substrate, e.g., a cable screen or connector about which the article is recovered, for example as described in U.S. Pat. No. 4,467,002 mentioned above. The curable adhesive or hot-melt adhesive may equally be employed on the end of the article intended to be recovered on the connector back shell and on the other end intended to be recovered about the cable. The conductive adhesive may be employed in combination with a conventional hot-melt or curable adhesive which, for example, could be located on that part of the article intended to be recovered over a cable jacket.

The adhesive composition need not be employed solely with dimensionally recoverable articles but may be used in numerous places where an electrically conductive adhesive joint is required. Thus the invention also provides an electrical cable which has been terminated by means of a connector and an enclosure that extends from the connector to the cable and has an electrically conductive screen, the electrically conductive screen and the cable shield being electrically connected by means of a polymer composition as described above.

Surprisingly we have found that it is possible to consolidate the composition by application of heat and/or pressure, preferably with sufficient heat and pressure to fuse the polymer particles and to force the composition into the desired shape, without any loss, or any significant loss in the electrical resistivity of the composition. Thus, according to another aspect, the invention provides a method of forming an electrically conductive adhesive composition which comprises:

(i) blending a solid fusible particulate polymer material with a quantity of metal particles to form a particulate blend; and (ii) subjecting the particulate blend of step (i) to heat and/or pressure to consolidate the polymer material.

The particulate composition according to the invention may be formed into a tape or sheet by heat and pressure, and in this form, may be employed for a number of purposes. For example a sheet formed from a curable material (that has cured during pressing) may be used as a conductive gasket. A tape or sheet formed from a hot-melt adhesive may be employed with a dimensionally recoverable article in the same manner as the particulate composition described above. In this case the tape or sheet may be wrapped to form a cylinder of the appropriate diameter and the article may be partially recovered about it so as to grip it.

The inhomogeneity of the adhesive after consolidation can be observed and determined by analysis of photomicrographs of the composition. The inhomogeneity can be quantified as a "degree of inhomogeneity" by means of the method described in Example 4 below. Thus, according to yet another aspect, the invention provides a polymer composition which comprises a sold fusible polymer material and a quantity of metal particles that have been blended with the particles of polymer material to render the composition electrically conductive, the composition having a degree of inhomogeneity of at least 400 $\mu m^2$; preferably at least 500 $\mu m^2$ and especially at least 600 $\mu m^2$.

The invention will now be described by way of example with reference to FIG. 1 which is a section through a cable termination and article recovered thereon.

Referring to FIG. 1, a cable 1 is terminated with a connector 2, and comprises wires 3, braid 4 for screening the cable and jacket 5. A dimensionally recoverable article or so-called "boot" 6 has been recovered about the connector and proximal end of the cable 1 to enclose the assembly. The boot 6 is provided with an internal tin coated copper e.m.i. screen 7 that extends substantially the whole length of the boot, the screen having a number of longitudinally extending corrugations or flutes that allow it to contract in circumference and accommodate recovery of the boot.

The unrecovered boot 6 is provided with a ring of particulate conductive epoxy adhesive 8 at the connector end, the adhesive being located on the internal surface of the end portion of the screen 7. In addition the boot is provided with a ring of particulate conductive hot-melt adhesive 9 and in the region of the other end, this ring also being located on the internal surface of the end portion of the screen 7. A second ring of conventional or particulate but electrically nonconductive adhesive 10 is provided between the adhesive 9 and the outlet of the boot.

In order to enclose the assembly, the boot 6 is slipped over it and positioned with engagement lip 11 in alignment with a corresponding annular recess 12 in the connector adaptor 2 of the connector. The boot 6 is then heated, for example, by means of a hot-air gun, until it recovers about the spin-coupling adaptor 2. As the boot recovers the epoxy adhesive 8 melts and enables a conductive bond to be formed between the spin coupling adaptor 2 and the boot 7. At the same time or at a later stage the other end of the boot 6 is recovered about the cable. As this end of the boot is heated the conductive hot-melt adhesive 9 and the conventional hot-melt adhesive 10 melt, the conductive adhesive 9 forming a bond with the braid 4 of the cable and the conventional hot-melt adhesive 10 forming a bond to the cable jacket.

The following Examples illustrate the invention:

EXAMPLE 1

The following hot-melt adhesive components:

|  |  | Parts by weight |
| --- | --- | --- |
| Polyamide | Unirex 2647 | 90 |
| Polyamide | Macromelt 6156 | 10 | were cryogenically ground to a particle size of 106 to 600 micrometers (with approximately two thirds the particles of particle size less than 300 micrometers) and blended together. To this various quantities of silver flake (Johnson Matthey FS2) of particle size 4 micrometers were incorporated and dry blended. 8.5 parts by weight of polyethylene oxide binder were blended into the resulting mixture. A slurry of the blend was then formed in approximately 100 parts water.

The bulk resistivity of the adhesive was determined by depositing a 2 mm thick layer of the slurry onto a tinned copper plate, evaporating the water at 40° C. for 24 hours, placing a further tinned copper plate on the dried adhesive, and heating the assembly to 150° to 200° C. for 10 to 20 minutes under a 300 g weight.

Figure 2:
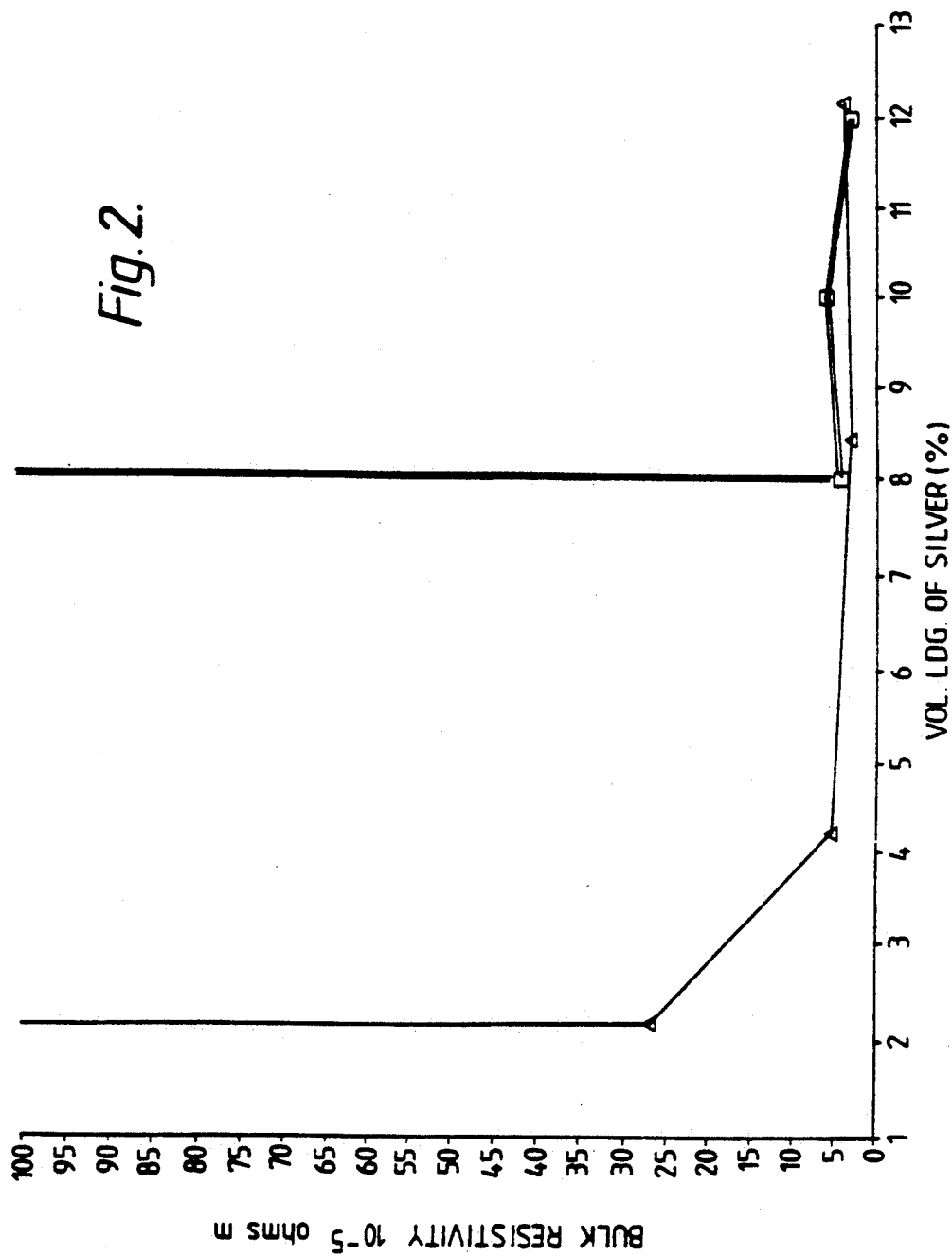
FIGS. 2 to 4 are graphs of the bulk resistivity of compositions of the invention and comparative compositions as a function of the loading of silver particles in the composition.

The adhesive exhibited the resistivity values given in table I and shown graphically in FIG. 2.

COMPARATIVE EXAMPLE 1

The same polyamide components as in Example 1 were dissolved in dichloromethane and mixed together, after which various quantities of the silver flake were added. The dichloromethane solvent was then removed by evaporation at 40° C. for 24 hours. The resulting material was cut into strips and formed into a plaque.

The bulk resistivity of the plaqued material was determined by sandwiching the plaque between two tinned copper plates and heating the assembly as described in Example 1.

The results are given in table I and shown graphically in FIG. 2.

TABLE I

| % Silver (by volume) | Example 1 Bulk Resistivity $10^{-5}$ ohm m | Comparative Example 1 Bulk Resistivity $10^{-5}$ ohm m |
| --- | --- | --- |
| 12.14 | 4 |  |
| 12 |  | 3 |
| 10 |  | 5.6 |
| 8.4 | 3 |  |
| 8 |  | 4.06 |
| 6.5 |  | 10156 |
| 4.2 | 5.3 |  |
| 2.2 | 27 |  |
| 1.1 | 412 |  |

EXAMPLE 2

Figure 3:
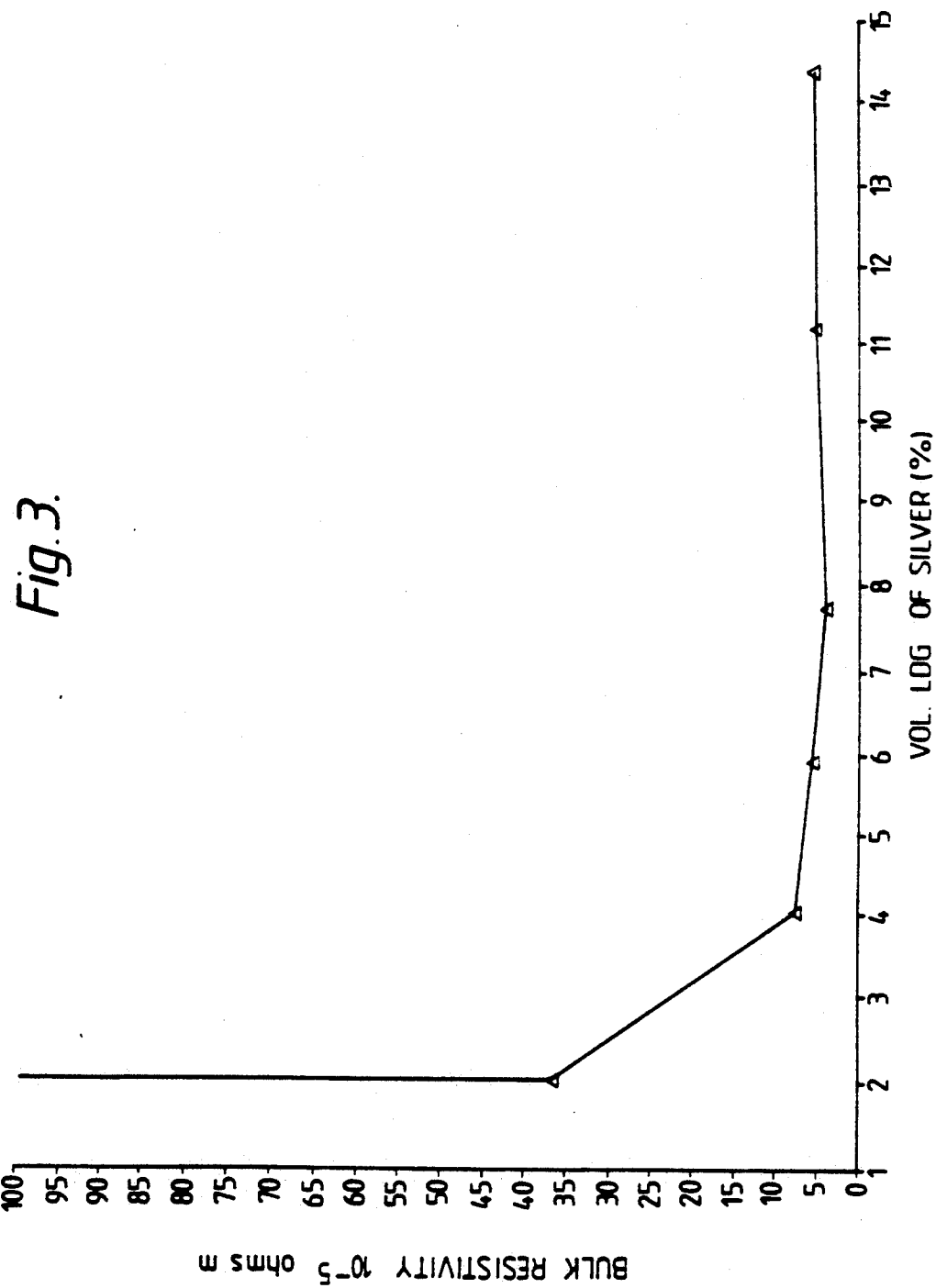
Figure 4:
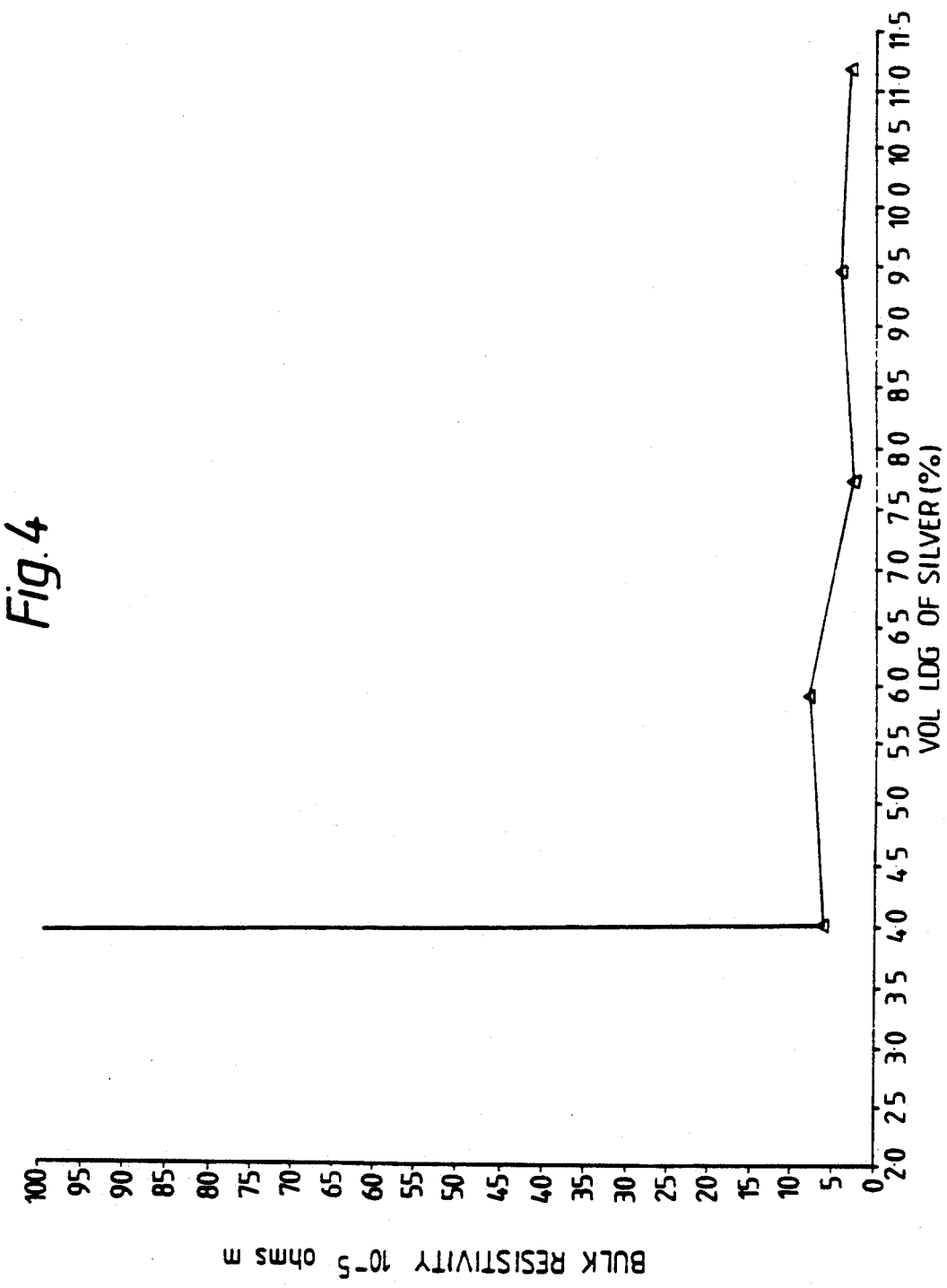

Example 1 and comparative Example 1 were repeated with the exceptions that the polyamide adhesives were replaced by an acid functionalised ethylene/vinyl acetate hot-melt adhesive terpolymer (CXA 2002 from Du Pont) and xylene replaced dichloromethane as solvent. The bulk resistivity was determined as in Example 1 and the values obtained are given in table II and values of the non-comparative Example are shown in FIG. 3.

TABLE II

| % Silver (by volume) | Example 2 Bulk Resistivity $10^{-5}$ ohm m | Comparative Example 2 Bulk Resistivity $10^{-5}$ ohm m |
| --- | --- | --- |
| 14.32 | 5.625 |  |
| 12.5 |  | 2.18 |
| 11.17 | 5.4 |  |
| 10.0 |  | 10.63 |
| 7.73 | 4.06 |  |
| 7.5 |  | 11884 |
| 5.91 | 5.66 |  |
| 4.02 | 7.56 |  |
| 2.05 | 36.5 |  |
| 1.0 | 1734 |  |

EXAMPLE 3

Example 1 was repeated with the exception that the polyamide adhesive components were replaced by the following reactive components:

|  | Trade name | Parts by weight |
| --- | --- | --- |
| Epoxy resin based on bisphenol A | DER 662 | 77 |
| Dimerised fatty acid reactive polyamide | Macromelt 6071 | 20 |
| Dimethylaminopyrodine accelerator |  | 3 |
| Polyethylene Oxide binder |  | 4 |

The components were cryogenically ground and the particles were graded so that no particles were greater than 300 micrometers in size.

The bulk resistivity was determined as in Example 1, and the results are given in table III.

TABLE III

| % Silver (by volume) | Bulk Resistivity $10^{-5}$ ohm m |
| --- | --- |
| 4 | 120 |
| 9 | 31 |
| 12 | 18.7 |
| 15 | 17 |
| 20 | 18.7 |

EXAMPLE 4

The EVA terpolymer adhesive and silver flake employed in Example 2 (without binder) were cryogenically ground to particle size of 106 to 600 micrometers and were dry blended together. The powered blend was then formed into a plaque at 120° C. over a period of about 2 minutes. The bulk resistivity of the plaqued material was determined as in comparative Example 1, and the results are given in table IV and given graphically in FIG. 5.

TABLE IV

| and shown graphically in FIG. 5 | |
| --- | --- |
| % Silver (by volume) | Bulk Resistivity $10^{-5}$ ohm m |
| 11.17 | 3.43 |
| 9.45 | 4.47 |
| 7.73 | 2.8 |

TABLE IV-continued and shown graphically in FIG. 5

| % Silver (by volume) | Bulk Resistivity $10^{-5}$ ohm m |
|---|---|
| 5.91 | 8.02 |
| 4.02 | 6.45 |
| 2.05 | 8625 |

A photomicrograph of a section through the plaqued material was taken, so that the distribution of silver particles within the material could be analyzed. A magnification of X600 was used. The photomicrograph thus obtained consisted of black regions corresponding to silver and white regions corresponding to the EVA terpolymer adhesive. The photomicrograph was then scanned using an optical line scanner and the information thus obtained from it was digitally stored by computer. The scanning resolution was $4.41 \times 10^{-8}$ mm² per bit of information (that is, each area of the photomicrograph corresponding to an area of $4.41 \times 10^{-8}$ mm² of the sample was stored in a file as being either black or white).

Each line, (of bits of information) corresponding to a row of squares of area $4.4 \times 10^{-8}$ mm² of the photo micrograph was then analyzed. For each line, the largest number of consecutive bits of information corresponding to silver (i.e. the largest unbroken region of silver in the line) was measured and converted into units of micrometers (referred to as W). Also, for each line, the number of discrete unbroken regions of silver per micrometer was measured (referred to as H and having units of counts per micrometer).

For each line, the value of W/H, measured in $\mu$m², was calculated and the best overall value of W/H for all the lines was determined using the method of least squares. This value is referred to as the "degree of inhomogeneity" and is used as a measure of the inhomogeneity of the plaqued blended material. The value for the degree of inhomogeneity obtained from the sample used in this example was 730 $\mu$m². The degree of inhomogeneity of a comparative sample prepared in accordance with Comparative Example 2 was determined by this method and was found to be 180 $\mu$m².

A 10 mm wide strip of the adhesive so formed was wrapped around a copper tube, and a dimensionally recoverable article as described in U.S. Pat. No. 4,467,002 was then recovered onto the adhesive strip. The assembly was heated to one of three temperatures, 100°, 125° and 150° C. for up to about 50 days, and the d.c. resistance of the adhesive bond was measured at various times. The results are shown graphically in FIG. 5 from which it can be seen that the bond is relatively insensitive to heat aging in this manner. The fact that the bond resistance was low and stable was not expected since the test temperature was considerably higher than the softening point of the adhesive (70°-75° C.).

A dimensionally recoverable screened moulded part according to U.S. Pat. No. 4,467,002 was recovered onto a harness having a metal braid and having a 10 mm wide strip of the adhesive so formed wrapped around the braid. The other end of the moulded part was recovered about a connector adaptor and bonded thereto by means of a silver flake loaded two part epoxy adhesive. The d.c. resistance was measured between the adaptor and the braid while the article was held at 75° C., i.e. just above the softening point of the adhesive. The results are shown in FIG. 6 in addition to the results obtained using a silver loaded two part epoxy adhesive. It can be seen that the results for the two adhesives are not significantly different and that the EVA adhesive exhibits a relatively stable conductivity at this temperature over a period of 200 days.

We claim:

1. An adhesive composition which comprises
   (a) a solid fusible particulate thermoplastic polymer material and
   (b) at least 4% by volume of metal particles that have been blended with the particles of polymer material to render the composition electrically conductive, the composition having (i) been consolidated by heat and/or pressure, (ii) a degree of inhomogeneity of at least 400 $\mu$m², and (iii) a resistivity not more than about $8 \times 10^{-3}$ ohm-cm.

2. A composition as claimed in claim 1, wherein the metal particles have an aspect ratio of at least 5.

3. A composition as claimed in claim 1, wherein the metal particles comprise flake.

4. A composition as claimed in claim 1, which includes not more than 12% by volume of the metal particles based on the total volume of the composition.

5. A composition as claimed in claim 1, wherein the polymer material is a hot-melt adhesive.

6. A composition as claimed in claim 5, wherein the adhesive comprises an ethylene/vinyl acetate copolymer, a polyester or a polyamide.

7. A composition as claimed in claim 5, which includes not more than 9% by volume of the metal particles.

8. A composition as claimed in claim 1, which includes from 5 to 12% by volume metal particles.

9. A composition as claimed in claim 1, wherein the ratio of the weight average size of the particles of polymer material to the weight average size of the metal particles is in the range of from 10:1 to 200:1.

10. A composition as claimed in claim 9 wherein the ratio is in the range of from 20:1 to 100:1.

11. A composition as claimed in claim 1, wherein the polymer material has a melt index of less than 100.

12. A composition as claimed in claim 1 which has been formed by a process which comprises
   (i) blending the particulate thermoplastic polymer material with the metal particles to form a particulate blend, and
   (ii) subjecting the particulate blend of step (i) to heat and/or pressure to consolidate the polymer material,
   said composition being in the form of a tape or sheet.

13. A composition according to claim 1 which has a resistivity of about $3 \times 10^{-3}$ to about $8 \times 10^{-3}$ ohm-cm.

14. An adhesive composition which comprises
   (a) a solid fusible particulate thermoplastic polymer material and
   (b) at least 4% by volume of silver particles that have been blended with the particles of polymer material to render the composition electrically conductive,
   the composition having (i) been consolidated by heat and/or pressure, (ii) a degree of inhomogeneity of at least 400 $\mu$m², and (iii) a resistivity not more than about $8 \times 10^{-3}$ ohm-cm.

15. A composition according to claim 14 wherein the silver particles have an aspect ratio of at least 5.

16. A composition according to claim 14 wherein the silver particles comprise flake.

17. A composition according to claim 14 which includes 5 to 12% by volume of silver particles.

18. A composition according to claim 14 wherein the ratio of the weight average size of the particles of polymer material to the weight average size of the silver particles is in the range of from 10:1 to 200:1.

19. A composition according to claim 14 wherein the polymer material is a hot-melt adhesive.

* * * * *

UNITED STATES PATENT AND TRADEMARK OFFICE
CERTIFICATE OF CORRECTION

PATENT NO. : 5,298,194
DATED : March 29, 1994
INVENTOR(S) : Carter et al.

It is certified that error appears in the above-indentified patent and that said Letters Patent is hereby corrected as shown below:

Column 1, line 27, replace "solutions" by --solution--.

Column 2, line 16, as a new line before "The composition", insert --DETAILED DESCRIPTION OF THE INVENTION--.

Column 7, line 2 (Table IV - continued, line 2), delete "and shown graphically in Fig. 5".

Column 7, line 24, replace "4.4 x $10^{-8}$ mm$^2$" by --4.41 x $10^{-8}$ mm$^2$--.

Column 7, line 38, replace "plagued" by --plaqued--.

Signed and Sealed this

Second Day of August, 1994

Attest:

BRUCE LEHMAN

*Attesting Officer*     *Commissioner of Patents and Trademarks*